United States Patent
Salvetat et al.

(10) Patent No.: US 12,525,489 B2
(45) Date of Patent: Jan. 13, 2026

(54) METHOD FOR TRANSFERRING A THIN LAYER ONTO A RECEIVER SUBSTRATE INCLUDING CAVITIES AND A REGION DEVOID OF CAVITIES

(71) Applicant: COMMISSARIAT A L'ENERGIE ATOMIQUE ET AUX ENERGIES ALTERNATIVES, Paris (FR)

(72) Inventors: Thierry Salvetat, Grenoble (FR); Guillaume Berre, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 570 days.

(21) Appl. No.: 17/445,521

(22) Filed: Aug. 20, 2021

(65) Prior Publication Data

US 2022/0068714 A1     Mar. 3, 2022

(30) Foreign Application Priority Data

Aug. 25, 2020    (FR) ...................................... 20 08660

(51) Int. Cl.
| | |
|---|---|
| *H01L 21/78* | (2006.01) |
| *H01L 23/13* | (2006.01) |
| *H01L 21/762* | (2006.01) |

(52) U.S. Cl.
CPC .......... *H01L 21/7806* (2013.01); *H01L 23/13* (2013.01); *H01L 21/76254* (2013.01)

(58) Field of Classification Search
CPC .......................... H01L 23/13; H01L 21/76254
See application file for complete search history.

(56) References Cited

U.S. PATENT DOCUMENTS

| | | |
|---|---|---|
| 2016/0233125 A1 | 8/2016 | Landru et al. |
| 2019/0202688 A1* | 7/2019 | Benaissa ........... H01L 21/76254 |

FOREIGN PATENT DOCUMENTS

| | | |
|---|---|---|
| FR | 3 032 555 A1 | 8/2016 |
| WO | WO 2014/206737 A1 | 12/2014 |

OTHER PUBLICATIONS

French Preliminary Search Report issued May 12, 2021 in French Application 20 08660 filed on Aug. 25, 2020, 2 pages (with English Translation of Categories of Cited Documents).

(Continued)

*Primary Examiner* — Samuel A Gebremariam
(74) *Attorney, Agent, or Firm* — Oblon, McClelland, Maier & Neustadt, L.L.P.

(57) ABSTRACT

A method for transferring a semiconductor layer from a donor substrate having a weakening plane to a receiver substrate having comprising a bonding face that has open cavities includes putting the donor substrate and the bonding face of the receiver substrate in contact, producing an assembly wherein the cavities are buried, and separating the assembly by fracture along the weakening plane. The bonding face of the receiver substrate includes, apart from the open cavities, a bonding surface that comes into contact with the donor substrate when the assembly is produced. The bonding surface includes a region devoid of cavities one dimension of which is at least 100 μm and which has a surface area of at least 1 mm$^2$, and an intercavity space that occupies from 15 to 50% of the bonding face of the receiver substrate.

18 Claims, 3 Drawing Sheets

(A)

(C)

(B)

(D)

(56) References Cited

OTHER PUBLICATIONS

Yun et al., "Fabrication of Silicon and Oxide Membranes Over Cavities Using Ion-Cut Layer Transfer", Journal of Microelectromechanical Systems, vol. 9, No. 4, Dec. 2000, 4 pages.

* cited by examiner

METHOD FOR TRANSFERRING A THIN LAYER ONTO A RECEIVER SUBSTRATE INCLUDING CAVITIES AND A REGION DEVOID OF CAVITIES

TECHNICAL FIELD

The field of the invention is that of the design of substrates containing buried cavities. The invention relates more particularly to transferring a thin layer to suspend it on initially open cavities and thus to seal these cavities.

PRIOR ART

Manufacturing buried cavities depends on suspending a thin layer (from a few nanometres to a few microns thick) on cavities of variable sizes and shapes, from a few microns for applications of the microelectromechanical resonator type to a few hundred microns for applications of the microelectronic assembly (packaging) type.

The most usual method for producing this suspension is that of thinning a silicon substrate or a silicon on insulator (SOI) substrate. Other methods use technologies of bonding, piercing of a substrate and chemical etching of the substrate for machining the cavities. These techniques, although mastered, are problematic in terms of cost (complete consumption of an SI substrate or worse of an SOI substrate), time (lengthy thinning method) and thickness of thin layer.

Smart Cut™ technology is a technique widely developed for approximately two decades to allow the transfer of thin layers of semiconductor materials. According to this technique, ion species such as hydrogen and/or helium are implanted in a donor substrate in order to form therein a weakening plane. The donor substrate is subsequently put in contact with a support substrate, for example by direct bonding. This technique then uses the development of the defects generated on the weakening plane. This development involves an addition of energy, generally implemented by means of a heat treatment of a few hundreds of degrees, typically 500° C., for a few tens of minutes. This leads to the formation of a confined layer of microcracks within which a fracture will initiate and propagate. This fracture separates the donor substrate along the weakening plane and a thin layer of the donor substrate is thus transferred to the support substrate.

During fracture annealing of the Smart Cut™ method, the species previously introduced by ion implantation to form the weakening plane reacts and forms defects at a certain depth in the donor substrate. These defects are pressurised and of two types dependent on the application or not of a stiffening effect.

When a stiffening effect is present, provided by a substrate bonded to the donor substrate or by a thick deposition thereon, the defects develop in the form of microcracks that preferentially propagate laterally and may attain sizes of a few hundreds of microns.

In the absence of a stiffening effect, on the other hand, the surface of the substrate being left free, the defects develop in the form of blisters that propagate horizontally and vertically, the growth thereof being limited by the phenomenon of exfoliation corresponding to decapsulation thereof.

The publication by C-H Yun and N. W. Cheung, "Fabrication of Silicon and Oxide Membranes Over Cavities Using Ion-Cut Layer Transfer", Journal of Microelectromechanical Systems, vol. 9, no. 4, December 2000, shows that a membrane of given thickness can be transferred successfully only onto cavities the size of which is below a limit size. This is related to the fact that, in the cavity, there is no stiffening effect. A blister may therefore develop, causing a deformation of the membrane, which may break (exfoliation), which leads to the local failure of the transfer.

The maximum size of the blisters, and therefore the size of the exfoliations, is thus critical in the method for transferring onto cavities since this growth mode is present in the cavities during the fracture annealing. Thus, if there is an exfoliation before the passage of the fracture, the cavity will be systematically pierced. Moreover, the applicant has been able to observe that, for identical implantation, bonding and heat-treatment conditions, a fracturing and therefore the transfer of a film can be obtained with a receiver substrate having a large surface area of bonding with the donor substrate whereas no fracture can be obtained, including by increasing the heat treatment time, in the case where the receiver substrate is entirely covered with cavities and therefore offers for the bonding with the donor substrate only the intercavity space present between the cavities and the peripheral exclusion region known by the term wafer edge exclusion.

DESCRIPTION OF THE INVENTION

The objective of the invention is to propose a technique for sealing cavities by means of a transfer, by Smart Cut™, of a thin layer of a donor substrate onto a receiver substrate, the receiver substrate being covered with multiple cavities and having a small bonding surface.

For this purpose, the invention relates to a method for transferring a semiconductor layer from a donor substrate comprising a weakening plane to a receiver substrate comprising a bonding face that has open cavities.

The method comprises the implementation, by putting the donor substrate and the bonding face of the receiver substrate in contact, of an assembly wherein said cavities are buried and the separation of the assembly by fracture alone the weakening plane. The bonding face of the receiver substrate includes, apart from the open cavities, a bonding surface that comes into contact with the donor substrate when the assembly is implemented. This bonding surface comprises a region devoid of cavities and an intercavity space that occupies from 15 to 50% of the bonding face of the receiver substrate.

The invention also relates to a substrate able to allow the implementation of the method, in particular a substrate comprising a bonding face having open cavities, intended to serve as a receiver substrate in a method for transferring a semiconductor layer from a donor substrate having a weakening plane to the receiver substrate, said method comprising the implementation, by putting the donor substrate and the bonding face of the receiver substrate in contact, of an assembly wherein said cavities are buried and the separation of the assembly by fracture along the weakening plane. The bonding face has, apart from the open cavities, a bonding surface that comes into contact with the donor substrate when the assembly is implemented, said bonding surface comprising a region devoid of cavities and an intercavity space that occupies from 15 to 50% of the face of the receiver substrate.

In a method or a substrate according to the invention, said region devoid of cavities:
- has for example a dimension of at least 100 μm and has a surface area of at least 1 mm$^2$;
- may be disposed at the rim of the bonding face of the receiver substrate, or in a part of this bonding face that is not at the rim (for example it is at the centre of this face). Certain preferred but non-limitative aspects of a method or of a substrate according to the invention are as follows, which may be combined with each other:

said region devoid of cavities is disposed at the rim of the bonding face of the receiver substrate and takes the form of a portion of a ring at the rim of this bonding face;

the intercavity space occupies from 20 to 40% of the bonding face of the receiver substrate;

a characteristic dimension of the cavities is less than or equal to a mean exfoliation radius determined by statistical analysis of microscopic observations of localised detachments of the surface of the donor substrate subjected to a fracturing heat treatment;

the characteristic dimension of the cavities is less than or equal to a minimum exfoliation radius determined by said statistical analysis;

a separation distance between contiguous cavities is such that the sum of the characteristic dimension of the cavities and of said separation distance is less than 100 µm;

said separation distance is greater than 1 µm;

the receiver substrate has a bevelled or chamfered edge and the region devoid of cavities at the rim of the bonding face emerges on said bevelled or chamfered edge;

the receiver substrate has no bevelled edge and, if the region devoid of cavities is on the rim of the bonding face, this region is present along the edge of the receiver substrate.

BRIEF DESCRIPTION OF THE DRAWINGS

Other aspects, aims, advantages and features of the invention will appear more clearly from a reading of the following detailed description of preferred embodiments thereof, given by way of non-limitative example, and made with reference to the accompanying drawings, on which.

DETAILED DESCRIPTION OF EMBODIMENTS

Figure 1:
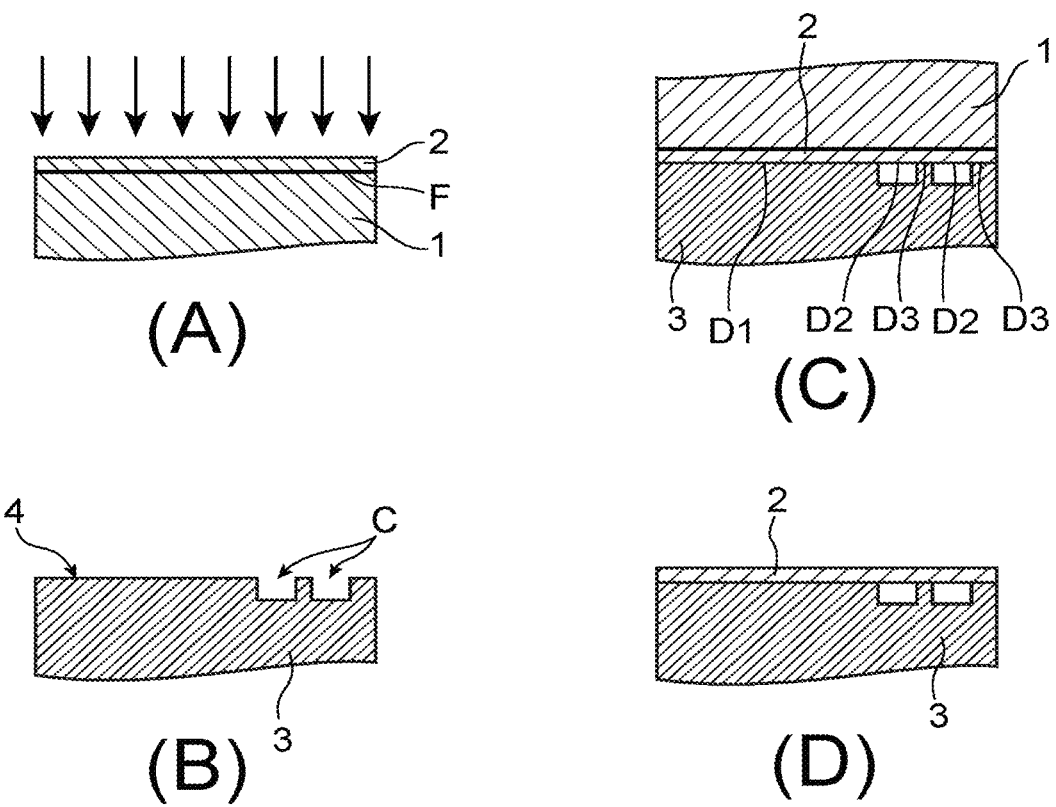
FIG. 1 is a diagram illustrating the various steps of a method according to the invention.

With reference to FIG. 1, the invention relates to a receiver substrate intended to be used in a method for transferring a semiconductor layer 2 from a donor substrate 1 to a receiver substrate 3.

One face 4 of the receiver substrate 3, referred to as the bonding face, includes a plurality of open cavities C, for example resulting from etching, which can potentially have different sizes and/or shapes. The cavities may for example have a square, rectangular, circular or triangular shape.

Transferring the semiconductor layer 2 onto the bonding face 4 of the receiver substrate aims at sealing all or some of these cavities. So that the invention finds an application to the manufacture of all types of device relying on the use of a suspended membrane, such as for example microma-chined ultrasonic transducers of the capacitive type (cMUT, standing for "capacitive Micromachined Ultrasonic Transducers").

The invention also relates to a transfer method using such a receiver substrate, the semiconductor layer 2 being able to be a layer of silicon, indium phosphide, germanium, lithium tantalate or gallium arsenide.

The method according to the invention comprises a step (A) of forming a weakening plane F in the thickness of the donor substrate 1 by means of an implementation of ionic species, for example hydrogen and/or helium. This weakening plane F delimits a superficial portion of the donor substrate that will form the thin layer 2 to be transferred from a solid part of the donor substrate.

The donor substrate 1 may be covered by a layer previously deposited thereon, for example a dielectric layer or a strained layer. The donor substrate 1 may also comprise a multilayer structure, for example a multimaterial multilayer structure (for example a deposit of oxide or silicon nitride, fine metallic deposits or other functional deposits). These deposits may be produced before the ion implantation (while remaining compatible therewith) or after the ion implantation (in this case, they must not have recourse to thermal budgets that may cause maturation of the defects in the implanted zone; they are thus typically produced at a temperature of less than 400° C., preferentially less than or equal to 350° C.), The method comprises a step (B) of supplying the receiver substrate 3, the representation of which in FIG. 1 is purely illustrative.

The method next comprises a step (C) of implementing, by putting the donor substrate 1 and the bonding face 4 of the receiver substrate 3 in contact, an assembly wherein all or some of the cavities are buried. The substrates 1, 3 are thus put in contact in such a manner that the thin layer 2 seals all or some of the cavities.

The method next comprises a step of separating the assembly (D) by fracture along the weakening plane F. This separation is obtained by means of an addition of energy, generally implemented by means of a heat treatment. This separation leads to the transfer of the thin layer 2 from the donor substrate 1 to the receiver substrate 3.

In the context of its research on the application of Smart Cut™ technology to the sealing of micrometric cavities, the applicant has been able to find that the maturation of the defects in proximity to the cavities is slowed or even inhibited. It has also been able to observe, according to the implantation conditions and the size of the cavities, the formation of blisters in the cavities that may as much as completely fill the cavities. These various types of defects are illustrated in step (C) of FIG. 1 where D1 represents a region at which microcracks develop in a conventional manner, where D2 represents a region at which blisters develop in the cavities and where D3 represents a region in which the growth of the microcracks is slowed or even inhibited because of the proximity of the cavities.

The idea at the basis of the present invention is to have a receiver substrate, certainly mainly endowed with cavities, but which has a sufficient surface area to provide the generation and growth of microcracks of the type D1 and thus to initiate the fracture at a selected position.

To do this, according to an example embodiment of the invention, apart from the open cavities, the bonding face 4 of the receiver substrate includes (preferably consists of) a bonding surface that comes into contact with the donor surface during the step (B) of implementing the assembly, said bonding surface comprising (preferably consisting of)

at least one region devoid of cavities at the rim of the bonding face of the receiver substrate and an intercavity space (corresponding to all the horizontal surfaces of the walls separating the cavities and excluding the region devoid of cavities on the rim) which occupies from 15 to 50% of the face of the receiver substrate.

The receiver substrate is thus mainly covered with cavities, the bonding surface nevertheless making it possible to ensure the appearance and growth of microcracks and to initiate fracture at a selected position, in this case at the rim of the bonding face.

Figure 2:
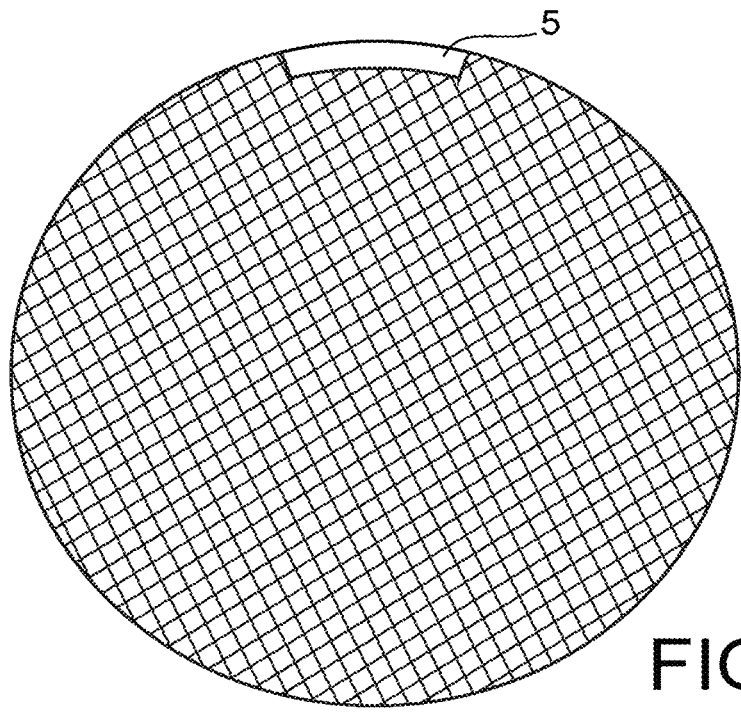
FIG. 2 is a diagram of a receiver substrate according to an example embodiment of the invention.
Figure 3:
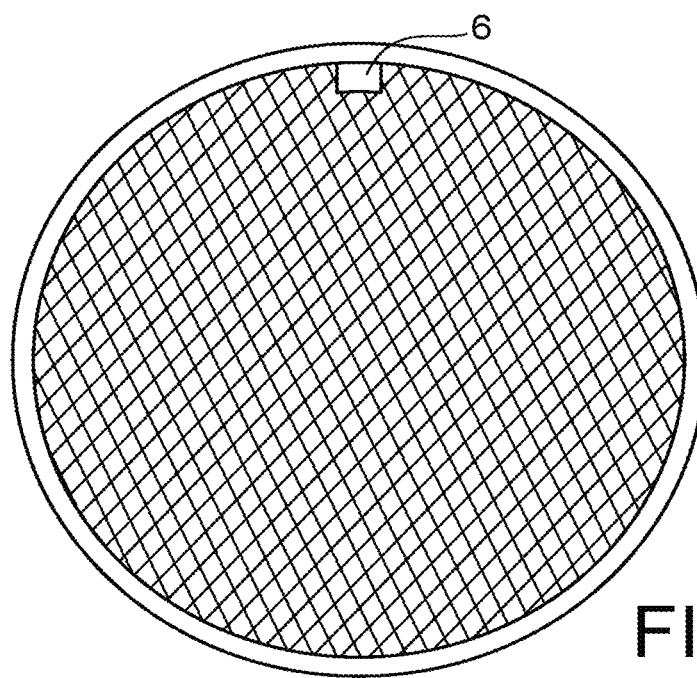
FIG. 3 is a diagram of another receiver substrate according to an example embodiment of the invention.

FIGS. 2 and 3 show embodiments of receiver substrates according to this example embodiment of the invention. The bevelled plate edge of the receiver substrate in FIG. 2 has been trimmed while the bevelled plate edge 7 of the receiver substrate of FIG. 3 has not been trimmed. In each case, the receiver substrate comprises a region devoid of cavities 5, 6 at the rim of the bonding face of the receiver substrate. This region is thus present along the edge of the substrate in FIG. 2 while it emerges on the bevelled edge of the substrate in FIG. 3, said bevelled edge not forming part of the bonding face of the receiver substrate put in contact with the donor substrate at step (C). Thus, in the invention, rim of the bonding face means the outer peripheral region of the bonding face (i.e. the periphery thereof) that comes into contact with the donor substrate during step (C). The rest of the bonding face of each of the receiver substrates of FIGS. 2 and 3 is occupied by cavities that here have mainly constant dimensions and spacing.

Since the initiation of the fracture is an essentially random statistical event, the larger the surface of the region devoid of cavities of the bonding face (for example at the rim thereof as explained above) of the receiver substrate, the higher the probability of the occurrence of the triggering of fracture in this region devoid of cavities. Provision is thus preferably made for this rim region devoid of cavities to have a surface area of at least 1 mm², preferably at least 3 mm², even more preferably at least 5 mm², for example 6 mm². The region devoid of cavities, for example at the rim of the bonding face, preferably has dimensions, measured in a plane parallel to the bonding face, the smallest of which is greater than or equal to 100 µm.

As shown in FIGS. 2 and 3, a region 5, 6 devoid of cavities, in the case where it is at the rim of the bonding face of the receiver substrate, may take the form of a portion of a ring. When this region takes the form of a portion of a ring, it is for example the radial dimension thereof (i.e. the thickness thereof) that forms the smallest dimension thereof and is thus preferably greater than or equal to 100 µm. The circumferential dimension of the portion of a ring (i.e. the annular length thereof) is for its part preferably no more than a quarter of the perimeter of the receiver substrate.

As explained above, the region devoid of cavities and the initiation zone may be disposed at the periphery of the bonding face of the receiver substrate. More generally, the region devoid of cavities, and therefore the initiation zone, may be at any point on this bonding face of the receiver substrate; this region devoid of cavities, measured in the plane of this face, is preferably greater than 1 mm² with a smallest dimension of at least 100 µm in said plane. Thus this region devoid of cavities may be at the centre of the bonding face or even in a part of the bonding face that is not at the periphery or at the rim thereof. The other aspects described above apply to this more general embodiment.

Whatever the embodiment envisaged (zone devoid of cavities at the rim, or not at the rim, of the bonding face), taking the example of square cavities of side a separated from each other by a distance b (width of the horizontal surface of the rectilinear walls separating the cavities), the intercavity space overall occupies (i.e. without taking into account the peripheral exclusion region of the receiver substrate or the region devoid of cavities) a percentage of the surface of the bonding face corresponding to the ratio $$\frac{(a+b)^2 - a^2}{(a+b)^2}.$$

To ensure effective bonding while allowing the fracture to initiate preferably at the region devoid of cavities, this ratio is preferably between 15 and 50%, even more preferably between 20 and 40%.

To avoid rupture of the thin layer 2 during the maturation of the defects or on passing the fracture, the cavities preferentially have a sizing adapted to the exfoliation dimensions of the donor substrate.

The exfoliation radius $R_{exfo}$ can be defined according to the following equation $$R_{exfo} = \frac{64}{3} * \frac{(1-v^2)}{Ek_BT} * \frac{1}{\alpha * \text{Dose}} * \sigma_{crit}^2 * e^2,$$

with u the Poisson's ratio, E the Young's modulus, $k_B$ the Boltzmann constant, T the temperature (K), α the effective dose fraction (%), Dose the implanted dose (at/cm²), $\sigma_{crit}$ the limit shear constant and e the thickness of the thin layer. This radius therefore depends on the implanted dose, the heat-treatment temperature and the thickness (and therefore the implantation energy) but also quantities that are difficult to quantify such as the limit shear stress $\sigma_{crit}$. It is consequently preferable to determine this damage experimentally by subjecting an implanted donor substrate to a heat treatment of the fracturing type (for example 1 h at 500° C. in the case of a silicon donor substrate). In the absence of a stiffening effect, this annealing causes the formation of blisters and localised exfoliations.

Figure 4:
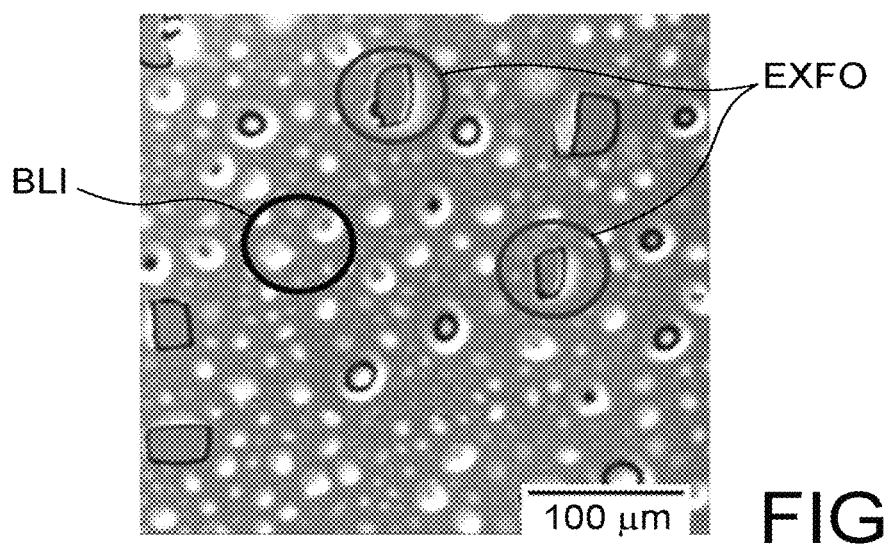
FIG. 4 illustrates a microscope observation of localised detachment of the surface of the donor substrate subjected to a fracturing heat treatment without stiffening effect.
Figure 5:
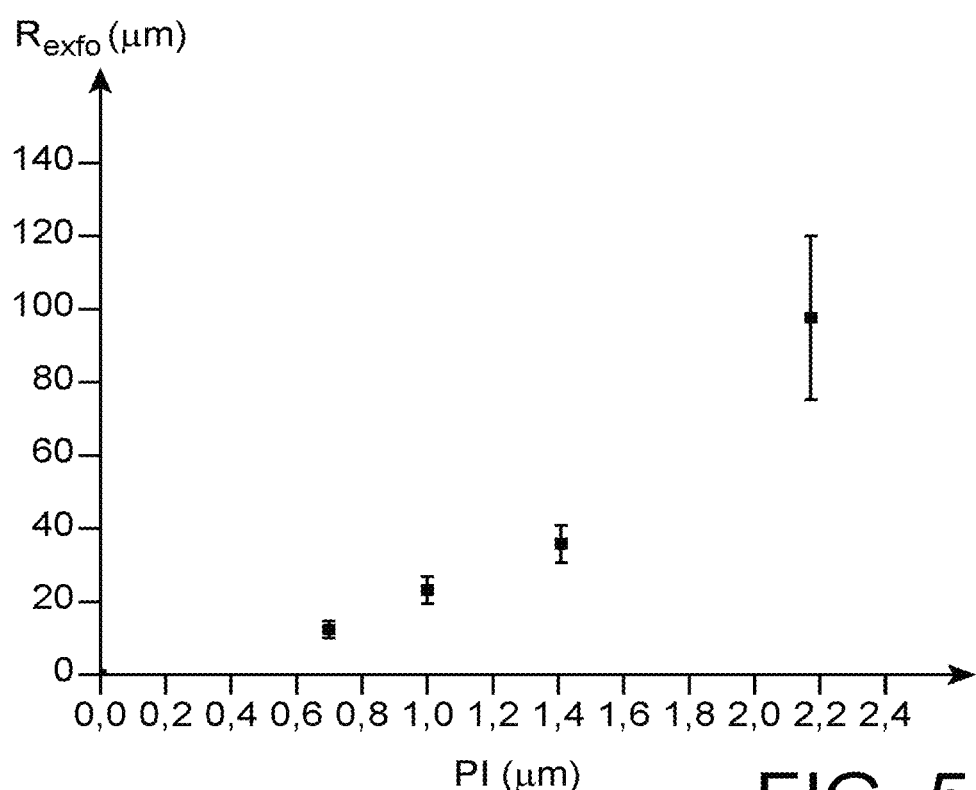
FIG. 5 shows an exfoliation radius according to the depth of implantation as determined by means of a microscope observation of the type in FIG. 4.

As shown in FIG. 4, optical-microscopy observations of the surface of the donor substrate make it possible to observe these blisters BLI and these exfoliations EXFO, the latter easily being locatable through the presence of a dark border on their contour. An image analysis makes it possible to measure the surface area of these exfoliations EXFO. The surface areas thus measured are converted into radius (considering the defects as circular). The dimensions thus extracted, in sufficient number to allow a statistical analysis (i.e. typically a population of several tens of exfoliations), then make it possible to define their minimum size ($R_{min\ exfo}$), average size ($R_{avg\ exfo}$) and maximum size ($R_{max\ exfo}$). FIG. 5 illustrates in this regard the radius $R_{exfo}$ of the exfoliations observed according to this experimental protocol for silicon substrates implanted at a fixed dose, according to the implantation energy here translated into implantation depth PI.

Provision is preferably made for a characteristic dimension of the cavities to be equal to the average radius, advantageously less than it and more advantageously still equal to or less than a minimum exfoliation radius $R_{min\ exfo}$ determined by statistical analysis of microscopic observations of localised detachments of the surface of the donor substrate subjected to a fracturing heat treatment. For example, if this minimum radius is 15 µm, the cavities can advantageously take the form of squares of 15×15 µm², circles with a diameter of 15 µm or lines 15 µm wide.

As for the intercavity space, this is preferably sized so that the separation distance between contiguous cavities is such that the sum of said characteristic dimension and of said separation distance is less than 100 µm, or even less than 80 µm, of even again less than 50 µm. Conversely, this separation distance is preferably chosen to be sufficiently great, typically greater than 1 µm, for example of the order of 7 µm, to allow effective bonding between the two substrates, according to the bonding method envisaged. According to one example, the inventors have been able to initiate the fracture at the centre of the bonding face of the receiver substrate with, at this centre, a cavity-free zone of 2 mm*2 mm (surface measured in the plane of the bonding face), the rest of the wafer having cavities of 20*20 µm² spaced apart by 7 µm.

The invention claimed is:

1. A method for transferring a semiconductor layer from a donor substrate comprising a weakening plane to a receiver substrate comprising a bonding face that has open cavities, comprising:
   producing, by putting the donor substrate and the bonding face of the receiver substrate in contact, an assembly wherein the cavities are buried, and
   separating the assembly by fracture along the weakening plane,
   wherein the bonding face of the receiver substrate includes, apart from the open cavities, a bonding surface that comes into contact with the donor substrate when the assembly is produced, the bonding surface comprising:
      a region devoid of cavities, one dimension of the region devoid of cavities is at least 100 µm and the region devoid of cavities has a surface area of at least 1 mm², and
      an intercavity space that occupies from 15 to 50% of the bonding face of the receiver substrate excluding the region devoid of cavities.

2. The method according to claim 1, wherein the region devoid of cavities is at a rim of the bonding face of the receiver substrate.

3. The method according to claim 2, wherein the region devoid of cavities takes a form of a portion of a ring at the rim of the bonding face of the receiver substrate.

4. The method according to claim 3, wherein
   the at least one dimension is a radial dimension, and
   the region devoid of cavities has a circumferential dimension being no more than a quarter of the ring at the rim of the receiver substrate.

5. The method according to claim 2, wherein the receiver substrate has a bevelled edge and wherein the region devoid of cavities at the rim of the bonding face emerges on the bevelled edge.

6. The method according to claim 2, wherein the receiver substrate has no bevelled edge and wherein the region devoid of cavities on the rim of the bonding face is present along the edge of the receiver substrate.

7. The method according to claim 2, comprising closing the cavities by bonding a surface of the donor substrate to the bonding surface of the receiver substrate.

8. The method according to claim 1, wherein the region devoid of cavities is at a center of the bonding face.

9. The method according to claim 1, wherein the intercavity space occupies from 20 to 40% of the bonding face of the receiver substrate.

10. The method according to claim 1, wherein a characteristic dimension of the cavities is less than or equal to a mean exfoliation radius determined by statistical analysis of microscopic observations of localised detachments of the surface of the donor substrate subjected to a fracturing heat treatment.

11. The method according to claim 10, wherein the characteristic dimension of the cavities is less than or equal to a minimum exfoliation radius determined by said statistical analysis.

12. The method according to claim 10, wherein a separation distance between contiguous cavities is such that a sum of the characteristic dimension of the cavities and of the separation distance is less than 100 µm.

13. The method according to claim 12, wherein the separation distance is greater than 1 µm.

14. A substrate comprising a bonding face having open cavities, configured to serve as a receiver substrate in a method for transferring a semiconductor layer from a donor substrate having a weakening plane to the receiver substrate, the method comprising producing, by putting the donor substrate and the bonding face of the receiver substrate in contact, an assembly wherein the cavities are buried and separating the assembly by fracture along the weakening plane,
   wherein the bonding face has, apart from the open cavities, a bonding surface that comes into contact with the donor substrate when the assembly is produced, the bonding surface comprising
      a region devoid of cavities, one dimension of the region devoid of cavities is at least 100 µm and the region devoid of cavities has a surface area of at least 1 mm², and
      an intercavity space that occupies from 15 to 50% of the face of the receiver substrate excluding the region devoid of cavities.

15. The substrate according to claim 14, wherein the region devoid of cavities is at a rim of the bonding face of the receiver substrate.

16. The substrate according to claim 14, wherein the region devoid of cavities is in a part of the bonding face of the receiver substrate that is not at a rim thereof.

17. The substrate according to claim 14, wherein the intercavity space occupies from 20 to 40% of the bonding face of the receiver substrate.

18. The substrate according to claim 14, wherein the cavities are closed by a surface of the donor substrate bonded to the bonding surface of the receiver substrate.

* * * * *